United States Patent [19]

Chen et al.

[11] Patent Number: 5,670,016

[45] Date of Patent: Sep. 23, 1997

[54] METHOD FOR CLEANING SUBSTRATE PRIOR TO TUNGSTEN DEPOSITION

[75] Inventors: Mao-Chieh Chen, Hsin Chu Shih; Wen-Kuan Yeh, Hsin Chu Hsien; Pei-Jan Wang; Lu-Min Liu, both of Hsin Chu Shih, all of Taiwan

[73] Assignee: National Science Council, Taipei, Taiwan

[21] Appl. No.: 558,099

[22] Filed: Nov. 15, 1995

[51] Int. Cl.⁶ .................................................. H01L 21/00

[52] U.S. Cl. ........................... 156/637.1; 156/638.1; 134/3; 134/34; 437/228 ST; 437/228 T; 252/79.2

[58] Field of Search ...................... 156/637.1, 639.1, 156/643.1, 638.1; 134/2, 3, 34; 437/228 ST, 228 T; 427/309; 252/79.2

[56] References Cited

U.S. PATENT DOCUMENTS

5,376,235  12/1994  Langley ........................ 156/638.1

OTHER PUBLICATIONS

"A Highly Reliable Selective . . . VLSI Contacts", by H. Kotani et al., *IEDM Tech. Digest*, 1987, pp. 217–220.

"High Rate Low–Temperature Selective Tungsten", by R.F. Foster et al., *Yungysen Workshop III, MRS* (NY, USA, 1988) pp. 69–72.

"Chemical Vapor Deposition of . . . Tungsten Silicide", by J.E.J. Schmitz, *Noyes Publications, NJ*, 1992 pp. 75–77.

"Selective CVD Tungsten . . . on VLSI Circuits", by Donald R. Bradbury et al., *IEDM Tech. Digest*, 1991, pp. 273–276.

"Handbook of Semiconductor Wafer Cleaning Technology", by Werner Kern, *Noyes Publication, NJ, USA,* 1993, pp. 120–124.

"Aluminum Etching in Carbon Tetrachloride Plasmas", by K. Tokunaga et al., *J.Electrochem. Soc.* 127, 1980 pp. 928–932.

"Comparison of Aluminum . . . Trichloride Plasmas", by K. Tokunaga et al., *J.Electrochem. Soc.* 128, 1981, pp. 851–855.

"Plasma Etching", by Dennis M. Manos, *Academic Press., CA, USA* 1989, pp. 153–155.

"Heavy Metal Contamination . . . Plasma Stripping", by S. Fujimura et al., *J.Electrochem. Soc.* 135, 1988 pp. 1195–1201.

"Issues with Selectively . . . Process Integration", by J.A. Sellers et al., *Mat.Res.Soc. Symp.Proc. VLSI V,* 1990 pp. 227–232.

"Segregation and Removal . . . and Fluorine Etchant", by Tadahiro Ohmi et al., *J.Electrochem. Soc.* 140, 1993, pp. 811–817.

"Study on Adhesion . . . Perfluoroalkoxy Resin Surface", by K. Ohtani et al., *J.Electrochem. Soc.,* 140, 1993 pp. 2244–2249.

"Generation Mechanism . . . after Ashing", by Akihiro Usujima et al., *J.Electrochem. Soc.,* 141, 1994 pp. 2487–2493.

"Multilevel Interconnect for ASIC . . . Via Resistance" by, Thien Nguye et al., *VMIC,* 1994 pp. 353–355.

"An Efficient Preclean . . . Submicron Tungsten Plugs" by Wen–Kuan Yeh et al., *J.Electrochem. Soc.,* 142, 1995 pp. 3584–3588.

*Primary Examiner*—William Powell
*Attorney, Agent, or Firm*—Birch, Stewart, Kolasch & Birch, LLP

[57] ABSTRACT

A method for cleaning a substrate prior to tungsten deposition is disclosed, said substrate having via holes and trenches lines thereon. The method includes steps of
providing a solution of hydroxylamine sulfate; dipping said substrate in said solution; and agitating said solution by an agitating device.

20 Claims, 3 Drawing Sheets

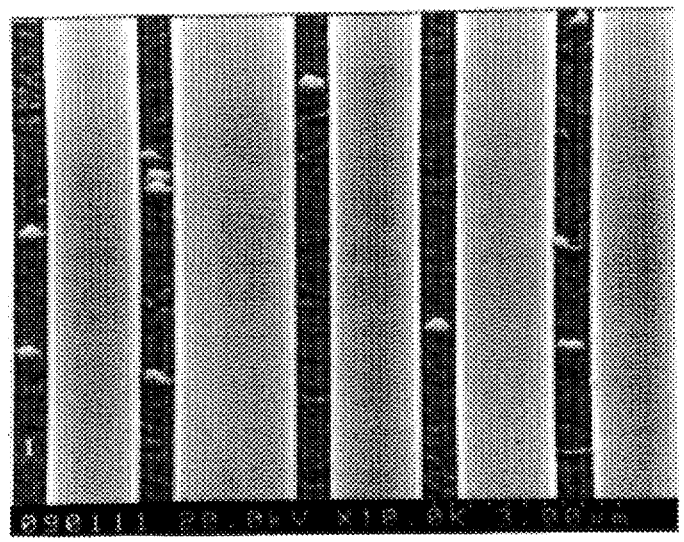
FIG. 1
FIG. 2
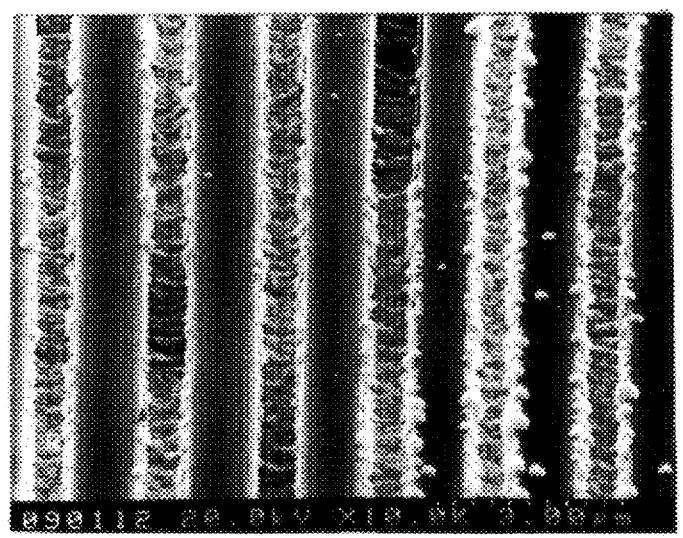

METHOD FOR CLEANING SUBSTRATE PRIOR TO TUNGSTEN DEPOSITION

FIELD OF THE INVENTION

The present invention relates to semiconductor integrated circuits and more particularly to a method for cleaning a substrate prior to tungsten deposition.

BACKGROUND OF THE INVENTION

When the device size of the integrated circuit develops into the deep sub-micron level, the conventional method of aluminum deposition cannot completely fill in the via holes so that it will cause the void phenomenon and even the open-circuit of the interconnection. Thus the yield and reliability of the circuit will be seriously affected. In the Ultra Large Scale Integrated Circuit, the formation of W-plug by tungsten chemical vapor deposition (W-CVD) is widely used in the multi-level interconnections nowadays.

One conventional tungsten chemical vapor deposition is blanket chemical vapor deposition (blanket CVD), that is, the tungsten film deposition is blankets the entire substrate having via holes thereon, and then the tungsten film on the silicon dioxide ($SiO_2$) is removed by chemical etching for the purpose of forming the W-plug. An alternative method is to selectively deposit the tungsten film on the via hole by selective W-CVD and therefore spares the chemical etching step.

The selective W-CVD uses silane ($SiH_4$) to decompose $WF_6$, thereby allowing tungsten to be selectively deposited on the aluminum rather than silicon dioxide. Whereas, for performing selective W-CVD on the substrate with free via holes, it is very hard to control the proper selectivity.

The first problem is local selectivity loss, i.e., the creep-up phenomenon. This phenomenon results from the fact that tungsten grows from the bottoms of the via holes and from the sidewalls of the via holes. Thus an accumulation situation arises in the openings of the via holes, and tungsten cannot completely fill in the via holes, thereby resulting in local selectivity loss. The reason for the above phenomenon is that during the time when the via holes are being formed, the aluminum in the bottom of the via holes will be redeposited on the sidewalls of the via holes and the photoresist. Although later on a photoresist stripping step is executed (in general, by ozone ($O_3$)), the metallic ions unfortunately cannot be completely removed, leading to the formation of metallic impurities consisting of photoresist and metal, which still remain on the surface of silicon dioxide and sidewalls of via holes. These impurities will induce tungsten molecules to be deposited thereon, and results in selectivity loss.

In addition, on the aluminum surface of the via holes, the aluminum, photoresist, and the vapor in the air will form an aluminum complex comprising O-H bonds, which will prevent the deposition of tungsten. The general photoresist and metal-stripping solution cannot completely remove said complex, thus a plasma etching prior to the deposition of tungsten is proposed to solve this problem, which is a conventional standard process anterior to selective W-CVD. This method can remove the complex on the surface of aluminum, but may also cause aluminum ions to be sputtered out and redeposited on the sidewalls of the via holes and the surface of the silicon dioxide, thereby resulting in the selectivity loss of tungsten deposition.

In the introduction of plasma etching process, the conventional method for removing the metallic oxide and heavy metallic ions is incorporated for reference.

1. Aqueous Cleaning Process

This method applies solution containing high reactivity elements to react with the metallic oxide and heavy metallic ions, thereby removing metal ions and forming pure metal surface. The preferred solution is a mixture of HCl, $H_2O_2$ and $H_2O$, for example, RCA-2, SC (standard), HPM (Hydrochloric/peroxide mix) and Huang B.

This solution can effectively remove the metallic oxide and heavy metallic ions, but has no effect on the metallic complex formed by photoresist and metal, and the chlorine therein will react with aluminum to form a hydroscopic material $AlCl_3$, which will attach to the surface of the wafer and result in selectivity loss of tungsten deposition.

2. Gas Phase Cleaning

This method uses vapor ions of high reactivity to react with the metallic oxide, thereby forming pure metal surface. The preferred gas is $BCl_3$ and $CCl_4$ ions. Considering that $CCl_4$ is a carcinogenic material and is highly poisonous, so $BCl_3$ is generally used. The reaction of $BCl_3$ and $Al_2O_3$ is shown as follows:

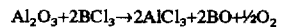

$$Al_2O_3 + 2BCl_3 \rightarrow 2AlCl_3 + 2BO + \tfrac{1}{2}O_2$$

$BCl_3$ molecules are delivered to the metal surface by carrier gas (for example, $N_2$) to achieve the reduction reaction. But, the above-mentioned process can only be guaranteed to completely remove the metallic oxide. As to the metallic complex, this process has no effect, even prolonging the clean time up to over five minutes. It is obvious that the cleaning of metallic complex is very difficult.

3. Plasma Enhanced Cleaning This is the above-mentioned plasma etching process. This method applies plasma generated from high frequency voltage discharge to enhance the generation of gas molecules (e.g., $BCl_3$) to form reactive radical (e.g., $Cl^-$), which will react with material over the metal surface to form volatile product, thereby cleaning the metal surface. This is the most effective conventional method for cleaning the metal surface.

Though this method can compulsorily remove the metallic oxide and metallic complex, the by-product during cleaning process, even the aluminum atoms, will be sputtered out and redeposited on the sidewalls of the via holes and the surface of silicon dioxide, resulting in selectivity loss of tungsten deposition. The former two cleaning methods, owing to the fact that the metallic complex cannot be effectively removed, are not suitable for substrate processing prior to tungsten deposition. Actually, the plasma enhanced cleaning method is the only conventional method for substrate processing prior to W-CVD.

How does the plasma enhanced etching method affect the selective W-CVD can be clearly understood by comparing the results of selective W-CVD with different pre-clean treatment using various $BCl_3$ plasma enhanced etching schemes. We can observe the selective W-CVD on sub-micron trench and via hole after different pre-clean processes.

FIG. 1 shows the result of selective W-CVD on sub-micron trenches of substrate (wafer) without any pre-clean process. Because the metallic oxide on the surface of aluminum is not removed, the tungsten cannot be effectively deposited on aluminum surface; only discrete tungsten crystal particles are observed.

FIG. 2 shows the result of selective W-CVD with the substrate precleaned by 50 W/60 sec $BCl_3$ plasma etching. After the plasma enhanced cleaning process prior to the tungsten deposition, tungsten can be effectively deposited on the surface of aluminum in the trench line under the same deposition condition. Whereas, also as in FIG. 2, a lot amount of tungsten particles are deposited along the sidewalls of the trench line, and some tungsten particles are deposited on silicon dioxide, thereby resulting in selectivity loss. If the power and etching time of the $BCl_3$ plasma are raised, the creep-up phenomenon and selectivity loss will be more serious, for example, under condition of 100 W/180 sec $BCl_3$ plasma etching, we can almost find no selective CVD on substrate but blanket deposition. On the other hand, if the power of the plasma is lowered, the selectivity loss still cannot be avoided. If we only apply $BCl_3$ without mining on plasma to execute surface-cleaning process of the substrate, the result is that uniform tungsten deposition cannot be found in the trench lines and deposition cannot be found in via holes, which indicate that the surface of aluminum is not completely cleaned.

SUMMARY OF THE INVENTION

One objective of the present invention is to provide a method for cleaning substrate prior to W-CVD. By the treatment of the substrate of the present invention, we can therefore obtain excellent selective W-CVD and via holes fill-in, and avoid selectivity loss.

In a specific embodiment, the present invention provides a method for cleaning a substrate prior to tungsten deposition, the substrate having via holes and trenches lines thereon, the method includes steps of providing a solution of hydroxylamine sulfate; dipping the substrate in the solution and agitating the solution by an agitating means at the same time. The method further includes steps of taking out the substrate from the solution; rinsing the substrate with deionized water; and drying the substrate by nitrogen blow.

Certainly, the solution can be at a temperature of about 60° C., the time for the dipping and agitating step can be about 60 to 90 seconds, hydroxylamine sulfate can be obtained by dissolving $(NH_2OH)_2 \cdot H_2SO_4$ in deionized water, and the solution can be at a concentration of 0.1M.

Certainly, bottoms of the via holes can have aluminum thereon, and the dipping and agitating step can have a dipping time of not over-etching aluminum of the bottoms.

Certainly, tungsten deposition can be selective tungsten chemical vapor deposition, and the agitating means can be an ultra-sonic agitator.

In an alternative embodiment, the present invention provides a method for fabricating semiconductor integrated circuits. The method includes steps of providing a semiconductor substrate having via holes and trenches thereon; dipping the substrate in a solution of hydroxylamine sulfate and agitating the solution by an agitating means at the same time. The method further includes steps of rinsing the substrate with deionized water; drying the substrate; and selectively depositing tungsten on the substrate.

Certainly, the tungsten deposition can be selective tungsten chemical vapor deposition.

BRIEF DESCRIPTION OF THE DRAWINGS

FIG. 1 shows the result of selective W-CVD on the sub-micron trenches of the substrate without any pre-clean process;

FIG. 2 shows the result of selective W-CVD on the sub-micron trenches of the substrate with the pre-clean process of $BCl_3$ plasma etching at 50 W for 60 seconds;

DESCRIPTION OF THE PREFERRED EMBODIMENT

One preferred embodiment of the present invention is shown as follows:

At first the hydroxylamine sulfate (which comprises $SO_4^{2+}$), for example $(NH_2OH)_2 \cdot H_2SO_4$, and deionized water are uniformly mixed to form a 0.1M solution (for example, 16 gm crystal mixed with 1000 c.c. deionized water), and then the solution is heated up to about 60° C. to make sure that the crystal are totally dissolved. The substrate patterned with trenches and via holes is put into the solution, and the ultra-sonic agitator is tamed on to agitate the solution for 90 seconds. The substrate is taken out of the solution and subsequently rinsed with the deionized water and dried by nitrogen blow, and then loaded into the selective W-CVD system.

The afore-mentioned cleaned substrate is loaded into the deposition chamber of W-CVD within 5 minutes, that is, the cleaned substrate exposes to the class 10 clean room environment for no more than 5 minutes (the clean room of class 10 means that there are not more than 10 particles of size larger than 0.5 micron in every cubic feet) to prevent the surface of the substrate from particle contamination and/or re-oxidation.

Figure 3A:
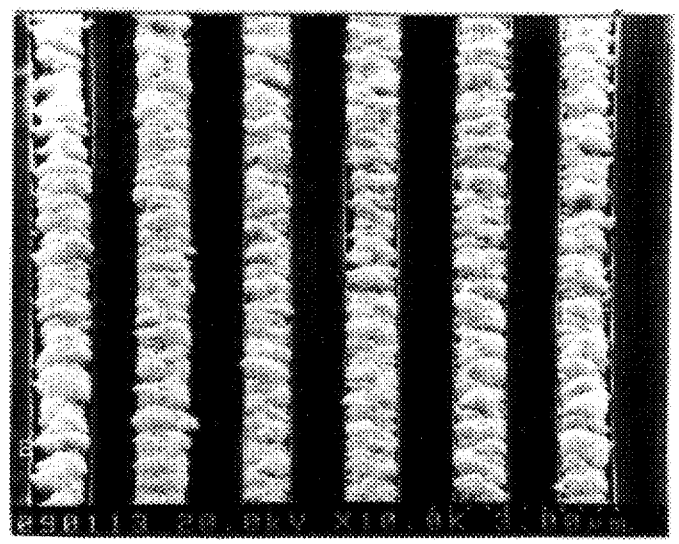
FIG. 3(a) shows the result of selective W-CVD on the sub-micron trenches of the substrate, which is pre-cleaned by the process according to the present invention.
Figure 3B:
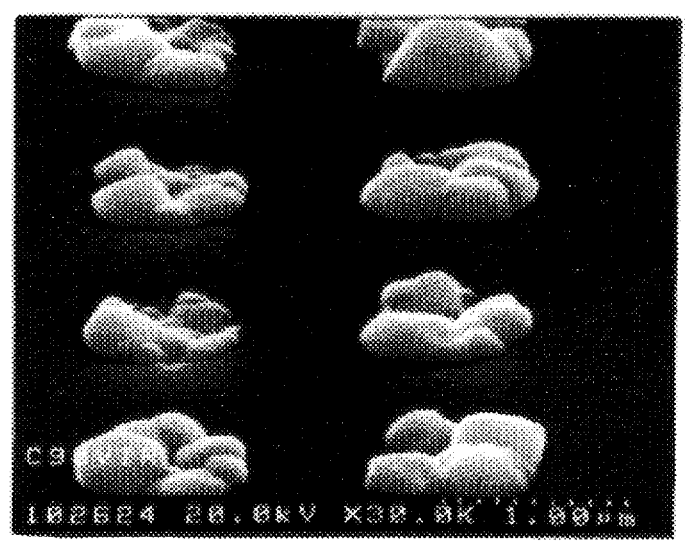
FIG. 3(b) shows the result of selective W-CVD on the sub-micron via holes of the substrate, which is pre-cleaned by the process according to the present invention.
Figure 3C:
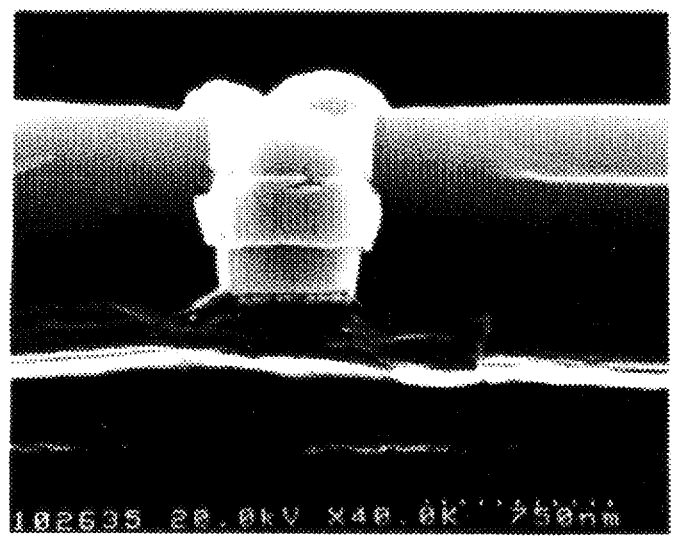
FIG. 3(c) shows the SEM cross-sectional view of a via hole filled with tungsten by selective W-CVD after the substrate is pre-cleaned by the process according to the present invention (i.e., the cross-sectional view of W-plug)

FIG. 3 shows the result of selective W-CVD on the patterned substrate which is pre-cleaned by the method according to the present invention, wherein FIG. 3(a) shows the result of W-CVD in the sub-micron trenches, FIG. 3(b) shows the result of W-CVD in the sub-micron via holes, and FIG. 3(c) shows the SEM cross-sectional view of a via hole filled with tungsten by selective W-CVD (i.e., the cross-sectional view of W-plug).

FIG. 3 indicates that the solution according to the present invention reduces the metallic complex originally existing in the trenches and via holes into pure clean aluminum surface, such that we can assure that tungsten can be selectively deposited in the trenches and via holes and will not cause any selectivity loss on the surface of silicon dioxide.

Figure 4:
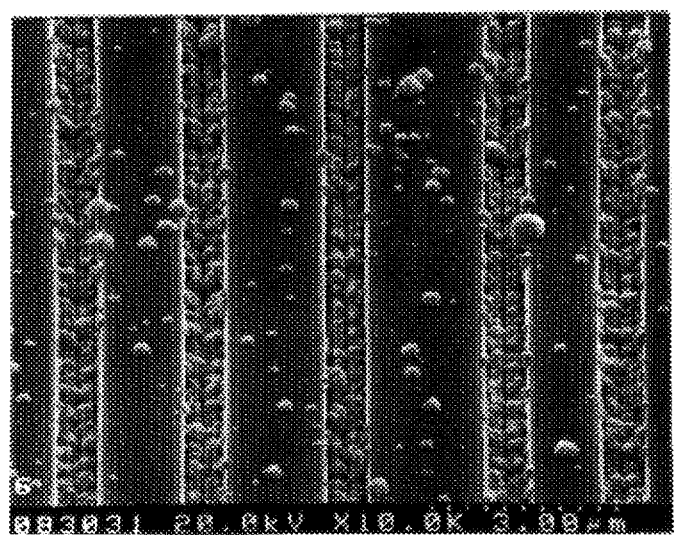
FIG. 4 shows the result of selective W-CVD on the sub-micron trenches of the substrate, which is pre-cleaned by the process according to the present invention followed by $BCl_3$ plasma etching at 50 W for 60 seconds.

FIG. 4 shows the result of selective W-CVD on the sub-micron trenches of the substrate, which is pre-cleaned by the process according to the present invention followed by $BCl_3$ plasma etching at 50 W for 60 seconds. It is clear that plasma etching process is the main cause for creep-up phenomenon and selectivity loss. If the substrate pre-cleaned by the process according to the present invention is first put into the plasma chamber and processed by $BCl_3$ plasma etching and then through selective W-CVD, the creep-up phenomenon of the trenches and via holes and the selectivity loss on the silicon dioxide occur again. Therefore, FIG. 4 indicates that during plasma etching, the aluminum atoms, which are sputtered out and then redeposited on the via holes/trenches and silicon dioxide, cause the creep-up phenomenon and the selectivity loss.

Table 1 shows the comparison of the above-described results of selective W-CVD with respect to various pre-clean processes of substrate.

TABLE 1

| PROCESS OF SUBSTRATE PRIOR TO W-CVD | SELECTIVE W-CVD | | |
|---|---|---|---|
| | DEPOSITION IN TRENCHES | DEPOSITION IN VIA HOLES | SELECTIVTY |
| METHOD OF THE PRESENT INVENTION | GOOD | GOOD | GOOD |
| METHOD OF THE PRESENT INVENTION FOLLOWED BY BCl$_3$ PLASMA ETCHING | HAVING CREEP-UP PHENOMENON | HAVING CREEP-UP PHENOMENON | HAVING SELECTIVITY LOSS |
| BCl$_3$ PLASMA ETCHING | HAVING CREEP-UP PHENOMENON | ALMOST NO DEPOSITION | HAVING SELECTIVITY LOSS |
| NO PRE-CLEAN OF SUBSTRATE | HARD TO DEPOSIT, ONLY FEW TUNGSTEN CRYSTAL PARTICLES | NO DEPOSITION | N/A |

According to the experimental results, if we use the plasma etching process, or the method of the present invention at first and then plasma etching process as the substrate pre-clean process prior to W-CVD, creep-up occurs on the edges of the trenches and at the mouth of the via holes, and selectivity loss occurs on the silicon dioxide. This is because plasma will cause the metallic complex on the surface of the aluminum to be sputtered out and redeposited on the silicon dioxide, thereby resulting in selectivity loss and preventing tungsten atoms from depositing in the trenches and via holes. Thus the trenches and via holes cannot be completely filled by tungsten, especially for via holes. Whereas, if we only apply the cleaning method of the present invention prior to W-CVD, the creep-up phenomenon will not occur.

To sum up, we have found that if we use the hydroxylamine sulfate solution of a proper concentration to execute the pre-clean of the substrate with trenches and via holes, purify the surface of aluminum and inactivate the silicon dioxide surface, we can obtain excellent selective W-CVD, as shown in FIG. 3. The pre-clean process of the substrate prior to W-CVD according to the present invention can not only assure tungsten to be selectively deposited in the trenches but also completely fill in the via holes, and the selectivity loss on silicon dioxide will not occur.

Of course, the afore-mentioned reducer treatment will not affect the tungsten/aluminum interface characteristic. With the electrical measurement, we confirm that the contact resistance of tungsten/aluminum does not increase by using the pre-clean treatment according to the present invention.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method for cleaning a substrate prior to a tungsten deposition, said substrate having via holes and trenches thereon, said method comprising steps of:
   providing a solution of hydroxylamine sulfate; and
   dipping said substrate in said solution and agitating said solution by an agitating means.

2. The method of claim 1 wherein said solution is at a temperature of about 60° C.

3. The method of claim 1 further comprising steps of:
   taking out said substrate from said solution;
   rinsing said substrate with deionized water; and
   drying said substrate by nitrogen blow.

4. The method of claim 1 wherein the time for said dipping and agitating step is about 60 to 90 seconds.

5. The method of claim 1 wherein said hydroxylamine sulfate is obtained by dissolving $(NH_2OH)_2 \cdot H_2SO_4$ in deionized water.

6. The method of claim 1 wherein said solution is at a concentration of 0.1M.

7. The method of claim 1 wherein bottoms of said via holes and trenches have aluminum thereon.

8. The method of claim 7 wherein said dipping and agitating step has a dipping time of not over-etching aluminum of said bottoms.

9. The method of claim 1 wherein said tungsten deposition is selective tungsten chemical vapor deposition.

10. The method of claim 1 further comprising steps of:
    taking out said substrate from said solution;
    rinsing said substrate with deionized water;
    drying said substrate by nitrogen blow; and
    selectively depositing tungsten on said substrate.

11. The method of claim 1 wherein said agitating means is an ultra-sonic agitator.

12. A method for fabricating semiconductor integrated circuits, said method comprising steps of:
    providing a semiconductor substrate having via holes and trenches thereon; and
    dipping said substrate in a solution of hydroxylamine sulfate and agitating said solution by an agitating means.

13. The method of claim 12 further comprising steps of:
    rinsing said substrate with deionized water;
    drying said substrate by nitrogen blow; and
    selectively depositing tungsten on said substrate.

14. The method of claim 13 wherein said tungsten deposition is selective tungsten chemical vapor deposition.

15. The method of claim 12 wherein said solution is at a temperature of about 60° C.

16. The method of claim 12 wherein the time for said dipping and agitating step is about 60 to 90 seconds.

17. The method of claim 12 wherein said hydroxylamine sulfate is obtained by dissolving $(NH_2OH)_2 \cdot H_2SO_4$ in deionized water.

18. The method of claim 12 wherein said solution is at a concentration of 0.1M.

19. The method of claim 12 wherein bottoms of said via holes and trenches have aluminum thereon, said dipping and agitating step has a dipping time of not over-etching aluminum of said bottoms.

20. The method of claim 12 wherein said agitating means is an ultra-sonic agitator.

* * * * *